United States Patent [19]
Hagiwara et al.

[11] Patent Number: 5,849,459
[45] Date of Patent: Dec. 15, 1998

[54] RESIN COMPOSITION FOR STEREOLITHOGRAPHY

[75] Inventors: Tsuneo Hagiwara; Yorikazu Tamura, both of Kanagawa, Japan

[73] Assignee: Teijin Seiki Co., Ltd., Osaka, Japan

[21] Appl. No.: 563,694

[22] Filed: Nov. 28, 1995

[30] Foreign Application Priority Data

Nov. 29, 1994 [JP] Japan ................................ 6-317780
Oct. 16, 1995 [JP] Japan ................................ 7-291699

[51] Int. Cl.⁶ ............................ G03F 7/028; G03F 7/20
[52] U.S. Cl. ............................ 430/280.1; 430/281.1; 430/269; 264/401; 522/170; 522/100; 522/16; 522/8; 522/20
[58] Field of Search ...................... 430/281.1, 280.1, 430/269; 522/170, 100, 16, 8, 20; 264/401

[56] References Cited

U.S. PATENT DOCUMENTS

| | | | |
|---|---|---|---|
| 4,839,401 | 6/1989 | Waknine | 522/14 |
| 4,942,060 | 7/1990 | Grossa . | |
| 5,236,967 | 8/1993 | Ohkawa et al. | 522/32 |
| 5,364,741 | 11/1994 | Huynh-Tran et al. | 430/300 |
| 5,368,985 | 11/1994 | Rutsch et al. | 430/269 |
| 5,399,770 | 3/1995 | Leppard et al. | 568/15 |
| 5,494,618 | 2/1996 | Sitzmann et al. | 264/401 |
| 5,496,685 | 3/1996 | Farber et al. | 430/281.1 X |

FOREIGN PATENT DOCUMENTS

| | | |
|---|---|---|
| 0 506 616 A1 | 9/1992 | European Pat. Off. . |
| 56-144478 | 11/1981 | Japan . |
| 60-247515 | 12/1985 | Japan . |
| 62-35966 | 2/1987 | Japan . |
| 63-92607 | 4/1988 | Japan . |
| 1-204915 | 8/1989 | Japan . |
| 1-213304 | 8/1989 | Japan . |
| 2-113925 | 4/1990 | Japan . |
| 2-145616 | 6/1990 | Japan . |
| 2-153722 | 6/1990 | Japan . |
| 2-208305 | 8/1990 | Japan . |
| 3-15520 | 1/1991 | Japan . |
| 3-20315 | 1/1991 | Japan . |
| 3-21432 | 1/1991 | Japan . |
| 3-41126 | 2/1991 | Japan . |
| 3-114732 | 5/1991 | Japan . |
| 3-114733 | 5/1991 | Japan . |
| A 04 180 904 | 6/1992 | Japan . |
| 5-5004 | 1/1993 | Japan . |
| 5-279436 | 10/1993 | Japan . |
| 6-228271 | 8/1994 | Japan . |
| 6-228413 | 8/1994 | Japan . |
| WO 96/00412 | 1/1996 | WIPO . |

OTHER PUBLICATIONS

63–92607: English Abstract of Japanese document 63–92607, Ueda et al, Patent Abstracts of Japan, vol. 12, No. 326, published Sep. 5, 1988.

88–151525: English Abstract of Japanese Document 63–92607, Sumitomo Chem IND KK, from WPIDS File, Derwent Information Ltd, document dated Apr. 23, 1988 as issue date.

109: 191579: English Abstract of Japanese Document 63–92607, Ueda et al, from Chemical Abstracts, ACS, Columbus Ohio, document dated Apr. 23, 1988.

Registry No. 2440–22–4 of Chemical Abstracts, ACS, Tinuvin P.

Registry No 84268–33–7 of Chemical Abstracts, ACS, Tinuvin 1130.

*Primary Examiner*—Cynthia Hamilton
*Attorney, Agent, or Firm*—Panitch Schwarze Jacobs & Nadel, P.C.

[57] ABSTRACT

A resin composition for stereolithography and a process for producing a three-dimensional object using the same. The resin composition comprises (1) a liquid photohardenable resin composition containing at least one of photopolymerizable compounds and a photosensitive polymerization initiator, and (2) at least one of radiation energy absorbers in an amount of from 0.001 to 1.0% by weight based on the total amount of the liquid photohardenable resin composition (1).

3 Claims, 1 Drawing Sheet

Figure
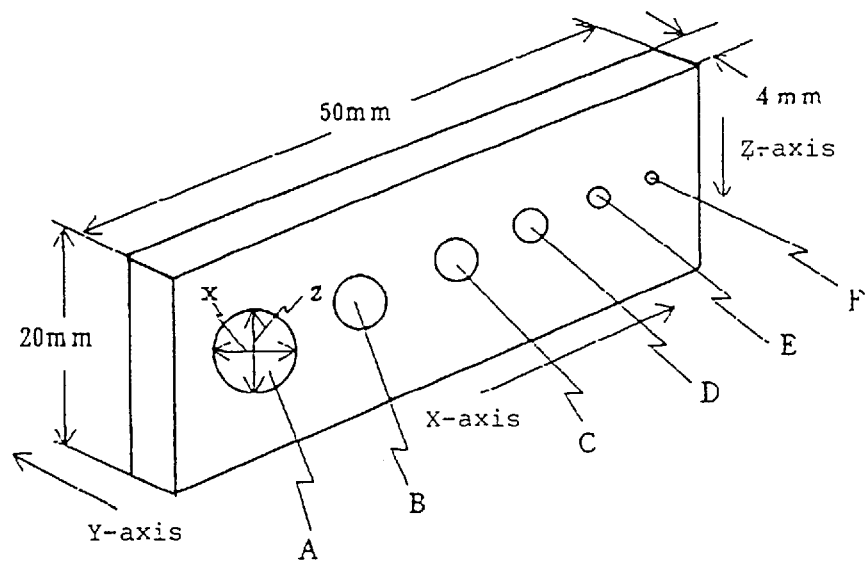

RESIN COMPOSITION FOR STEREOLITHOGRAPHY

FIELD OF THE INVENTION

The present invention relates to a resin composition for stereolithography (also called "three dimensional molding by photohardening") and a process for producing a three-dimensional object by stereolithography using the same. More particularly, it relates to a resin composition for stereolithography which provides three-dimensional objects having not only excellent dimensional accuracy and dimensional stability especially in the direction of light penetration (hereinafter sometimes referred to as a Z-axial direction) but also excellent physical and mechanical characteristics, such as hardness, tensile strength, and tensile modulus.

BACKGROUND OF THE INVENTION

A stereolithography process for producing a three-dimensional object is disclosed in JP-A-56-144478 (the term "JP-A" as used herein means an "unexamined published Japanese patent application"), which comprises applying a requisite amount of controlled light energy to a liquid photohardenable resin to harden the irradiated resin in a thin layer, supplying the liquid photohardenable resin on the hardened layer, followed by irradiation under control to harden the resin in a thin layer to be integrally superposed on the previously formed layer, and repeating these steps until a desired solid three-dimensional object is built up. Ever since a basic process in which the stereolithography technique can be put to practical use has been proposed in JP-A-60-247515, a number of proposals concerning stereolithography have been made, as disclosed, e.g., in JP-A-62-35966, JP-A-1-204915, JP-A-1-213304, JP-A-2-28261, JP-A-2-80422, JP-A-2-80423, JP-A-2-113925, JP-A-2-145616, JP-A-2-208305, JP-A-2-153722, JP-A-3-21432, JP-A-3-41126, JP-A-6-19962, JP-A-5-5004, JP-A-5-279436, JP-A-6-19962, JP-A-6-228413, and JP-A-6-228271.

A typical and commonly used process for producing a three-dimensional object by stereolithography comprises selectively applying a computer-controlled ultraviolet (UV) laser beam to the liquid surface of a liquid photohardenable resin composition in a container according to a designed pattern to harden the resin to a prescribed depth (thickness), supplying the liquid resin composition on the hardened layer to the thickness corresponding to one layer, applying a UV laser beam thereto to successively form a hardened layer on the preceding layer, and repeating these steps until a three-dimensional object having the entire three-dimensional object has been built up. This process has recently been attracting attention because three-dimensional objects having complicated shapes can be obtained easily in a relatively short time.

With the recent broadening of application of stereolithography from concept models to test models and trial products, there has been an increasing demand to provide three-dimensional objects having still higher dimensional accuracy and dimensional stability. The objects have also been demanded to have excellent mechanical properties.

Photohardenable resin compositions generally used in stereolithography comprise at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. For the purpose of improving dimensional accuracy, dimensional stability, and mechanical characteristics, various proposals have been made in the above-enumerated publications with regard to the kinds of the photo-polymerizable compounds and initiators, etc., but the aims have not yet been accomplished sufficiently.

Further, for the purpose of preventing shrinkage of a three-dimensional object obtained by stereolithography, there has been proposed the addition into a photohardenable resin composition of an additive that is soluble in the composition while being separated from the composition on hardening to form a different phase (as described in JP-A-3-20315) or the addition of a polymeric coagulating material which coagulates when heated (as described in JP-A-3-104626). However, it is difficult to select the additive, which can form different phases on hardening or to select the polymeric coagulating material, which coagulates when heated, and further it is difficult to dissolve the additive or the polymeric coagulating material stably in the photohardenable composition. Moreover, because the additive or the polymeric coagulating material forms a different phase on hardening in the photohardened resin composition, there are disadvantages that a transparent three-dimensional object cannot be obtained, and that the continuous phase cannot be firmly formed to induce the phase separation, which reduces the mechanical strength of a hardened product. Therefore, these processes have not brought about advantageous effects.

On the other hand, it is necessary to increase the hardening reaction rate in order to form a three-dimensional object by stereolithography in a short time with high productivity. For this purpose, irradiation with high energy for photopolymerization is required. However, if the applied light energy is very high, the penetration depth in the direction of irradiation (Z-axis) is larger than necessary and tends to be nonuniform. It follows that the hardening of the resin in the Z-axis is nonuniform, the thin layer formed of the hardened resin has an uneven thickness, and the three-dimensional object formed by laminating of infinite thin layers of uneven thickness will have markedly deteriorated dimensional accuracy and dimensional stability, particularly in the Z-axial direction. That is, an increase in reaction rate in hardening and an improvement in dimensional accuracy or dimensional stability of the resulting three-dimensional object are conflicting with each other, difficult to be satisfied simultaneously.

Under these circumstances, there have been made various studies and proposals concerning apparatus, methods of control on light irradiation, and the formulations of a photohardenable resin composition to be used in stereolithography to control and to make the Z-axial penetration depth uniform, while increasing the reaction rate of the resin and reducing the time of reaction by applying high light energy. Among the proposals concerning the material, there is the addition of a polarizing substance, which is capable of polarizing (scattering) light applied in the Z-axis to other directions including the X-axis and the Y-axis, into a photohardenable resin composition, as described in JP-A-3-15520, JP-A-3-41126, JP-A-3-1147732, and JP-A-3-114733. According to this process, light having proceeded in the Z-axis is struck against a light polarizing substance (light scattering substance) present in the photohardenable resin composition and thus polarized (scattered). As a result, the unnecessary penetration of the axial light into the Z-axial direction is avoided, and the resin is hardened more uniformly in the Z-axial direction than in the conventional techniques.

In this technique, however, light which has been struck against the light polarizing substance (light scattering substance) and polarized (scattered) reaches over the prescribed boundaries at the XY surface, making it difficult to control the hardening of the resin in other directions including the X- and Y-axial directions perpendicular to the Z-axis. It is likely that the scattered light induces unnecessary photo-hardening, which results in obscure boundaries on the XY surface between the area to be irradiated and those which should not be irradiated, failing to provide a three-dimensional object with a clear outline. Light irradiation could be controlled under considering the quantity of light scattered over the XY surface, but such control would be extremely complicated. In addition, the process necessitates previous addition of particulate light polarizing substance (light scattering substance) to a liquid photohardenable resin composition or addition of a substance capable of separating from the resin matrix phase upon photohardenable. As a result, a transparent object is hardly obtainable. If a colored object is intended, the color tone tends to be whitened and unclear.

SUMMARY OF THE INVENTION

An object of the present invention is to provide a resin composition for stereolithography which can provide a high quality three-dimensional object excellent in dimensional accuracy and dimensional stability, and further excellent in mechanical characteristics such as hardness, tensile strength and tensile modulus, at a high formation speed and with good productivity.

Another object of the present invention is to provide a stereolithography process for producing a high quality three-dimensional object having the above-mentioned excellent characteristics at a high formation speed and with good productivity.

The inventors of the present invention have conducted extensive Investigations in pursuit of means for simultaneously satisfying the essentially conflicting requirements, i.e., an improvement in reaction rate by irradiation with high energy of light (reduction in forming time) and improvements in dimensional accuracy and dimensional stability of a three-dimensional object formed. It has been unexpectedly found, as a result, that the Z-axial penetration depth of light can be satisfactorily controlled without impairing the reaction rate of a photohardenable resin (the extent of photohardening) by adding to a photohardenable resin composition a radiation energy absorber which has never been considered-applicable to resin compositions for stereolithography because of possible hindrance to photohardening of the composition. It has been ascertained that a high quality three-dimensional object having excellent dimensional accuracy and dimensional stability particularly in the Z-axial direction can be obtained from the resin composition containing radiation energy absorber at a high fabrication speed. The resulting three-dimensional object has been revealed to have not only excellent dimensional accuracy and dimensional stability but excellent mechanical characteristics such as hardness, tensile strength and tensile modulus. The present invention has been completed based on these findings.

The present invention relates to a resin composition for stereolithography comprising (1) a liquid photohardenable resin composition containing at least one of photo-polymerizable compounds and a photosensitive polymerization initiator, and (2) at least one of radiation energy absorbers in an amount of from 0.001 to 1.0% by weight based on the total amount of the liquid photohardenable resin composition (1).

The present invention also relates to a process for fabricating an integral three-dimensional object from successive layers of a photohardenable liquid resin composition, the process comprising the steps of:

(a) forming a layer of a photohardenable liquid resin composition;

(b) photohardening at least a portion of the layer of the photohardenable liquid resin composition by exposure to an actinic radiation to form a hardened layer;

(c) introducing a new layer of the photohardenable liquid resin composition onto the hardened layer formed by exposure to an actinic radiation;

(d) photohardening at least a portion of the new layer of the photohardenable liquid resin composition by exposure to an actinic radiation;

(e) repeating the steps (c) and (d), the photohardenable liquid resin composition being the resin composition for stereolithography according to the present invention.

BRIEF DESCRIPTION OF THE DRAWING

Figure illustrates the structure of the three-dimensional object prepared in Example 12 and Comparative Example 3.

DETAILED DESCRIPTION OF THE INVENTION

The terminology "radiation energy absorber" as used herein denotes a compound having higher absorbancy of light energy than a photo-polymerizable compound which is a main component of a photohardenable resin composition (e.g., polymerizable monomers, oligomers and polymers) and a photosensitive polymerization initiator which is also contained in the photohardenable resin composition and having no or little ability of initiating photopolymerization.

Radiation energy absorbers which can be used in the present invention are not particularly limited as long as the above-described properties are provided, and can be selected appropriately depending on the kinds or amounts of the photo-polymerizable compounds and initiators constituting the photohardenable resin composition and the kinds and intensity of the light to be used.

While not limiting, UV (ultraviolet) light or light containing UV light is generally used as light energy sources in stereolithography. Hence, compounds having high UV absorbance are preferred as radiation energy absorber. In particular, compounds having an absorbance in a wavelength region of from 300 to 350 nm of at least 0.1 are preferred. The "absorbance" as used herein is an absorbance of a solution obtained by dissolving 1 mg of a compound in 100 ml of ethanol which is placed in a quartz cell having a light path length of 10 mm as hereinafter described in detail.

Measurement of Absorbance of Radiation energy absorber:

One milligram of a radiation energy absorber is dissolved in 100 ml of ethanol at 25° C. A 5 ml aliquot of the solution (25°) is sealed in a quartz cell having an optical path length of 10 mm, and an absorbency in a wavelength region of 300 to 350 nm is measured with a spectrophotometer UV-210A manufactured by Shimadzu Corp.

It is preferred that the radiation energy absorber to be used is uniformly soluble in-the photohardenable resin composition for assuring excellent characteristics of three-dimensional objects formed, such as dimensional accuracy, dimensional stability, and mechanical characteristics, and for ease of handling of the resin composition.

Examples of the radiation energy absorbers which can be preferably used in the present invention include benzotriazole compounds, benzophenone compounds, phenyl salicylate compounds, and cyanoacrylate compounds. These compounds may be used either individually or as a combination of two or more thereof.

Specific examples of the benzotriazole compounds include those represented by formula (I):

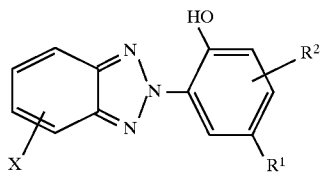

wherein $R^1$ and $R^2$, which may be the same or different, each represent a hydrogen atom, a linear or branched alkyl group having from 1 to 20 carbon atoms which may have a substituent (such as an alkyl group, e.g., methyl, ethyl, t-butyl, t-amyl, t-octyl and $C_{12}H_{25}$; an aralkyl group such as α,α-dimethylbenzyl; and a substituted alkyl group, e.g., —$CH_2CH_2(C=O)OR'$, wherein R' represents $C_8H_{17}$ and the like), or a substituted or unsubstituted phenyl group; and X represents an hydrogen atom or a halogen atom.

Still preferred among the compounds of formula (I) are 2-(2'-hydroxy-5'-methylphenyl)benzotriazole, 2-(2'-hydroxy-5'-octylphenyl)benzotriazole, 2-(2'-hydroxy-3',5'-di-t-butylphenyl)benzotriazole, 2-(2'-hydroxy-5'-t-butylphenyl)benzotriazole, 2-(2'-hydroxy-3'-t-butyl-5'-methylphenyl)benzotriazole, 2-(2'-hydroxy-3'-butyl-5,-(2"-carboxyoctylethyl)phenyl)benzotriazole, 2-(2'-hydroxy-3', 5'-di-t-amylphenyl)benzotriazole, 2-(2'-hydroxy-3'-t-butyl-5'-methylphenyl)benzotriazole, 2-(2'-hydroxy-3'-t-butyl-5'-methylphenyl)-5-chlorobenzotriazole, and 2-(2'-hydroxy-3', 5'-di-t-butylphenyl)-5-chlorobenzotriazole.

Specific examples of the benzophenone compounds include those represented by formula (II):

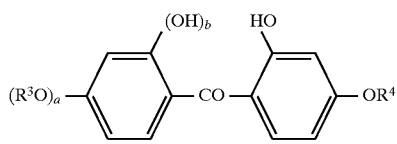

wherein $R^3$ and $R^4$, which may be the same or different, each represent a hydrogen atom, a linear or branched alkyl group having from 1 to 20 carbon atoms which may have a substituent (such as methyl, octyl/octadecyl and dodecyl), or a substituted or unsubstituted phenyl group; and a and b, which may be the same or different, each represent 0 or 1.

Still preferred among the compounds of formula (II) are 2,4-dihydroxybenzophenone, 2-hydroxy-4-methoxybenzophenone, 2-hydroxy-4-octoxybenzophenone, 2-hydroxy-4-dodecyloxybenzophenone, 2-hydroxy-4-octadecyloxybenzophenone, 2,2'-dihydroxy-4-methoxybenzophenone, and 2,2'-dihydroxy-4,4'-dimethoxybenzophenone.

Apart from these benzophenone compounds of formula (II), benzophenone compounds having no such substituent as a hydroxyl group on its benzene nuclei are widely used as photosensitive polymerization initiators in photohardenable resin compositions containing radical polymerizable compounds. However, the benzophenone compounds which can be used as radiation energy absorber in the present invention denote those having no ability of photopolymerization initiation as stated above and should be clearly distinguished from the benzophenone compounds used as an initiator.

From this viewpoint benzophenone compounds useful as photosensitive polymerization initiator are not included under the terminology "radiation energy absorber" as meant in the present invention.

Specific examples of the phenyl salicylate compounds include those represented by formula (III):

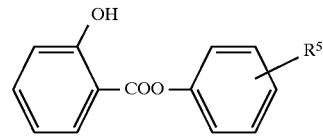

wherein $R^5$ represents a hydrogen atom, a linear or branched alkyl group having from 1 to 20 carbon atoms which may have a substituent (such as t-butyl/dodecyl and octyl), or a substituted or unsubstituted phenyl group.

Still preferred of the compounds of formula (III) are phenyl salicylate, p-methylphenyl salicylate, p-octylphenyl salicylate, p-t-butylphenyl salicylate, and p-dodecylphenyl salicylate.

Specific examples of the cyanoacrylate compounds include those represented by formula (IV):

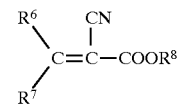

wherein $R^6$ and $R^7$, which may be the same or different, each represent a hydrogen atom, a linear or branched alkyl group having from 1 to 20 carbon atoms which may have a substituent, or a substituted or unsubstituted phenyl group (such as unsubstituted phenyl); and $R^8$ represents a linear or branched alkyl group having from 1 to 20 carbon atoms (such as ethyl and 2-ethylhexyl).

Still preferred of the compounds of formula (IV) are 2-ethylhexyl-2-cyano-3,3-diphenyl acrylate and ethyl-2-cyano-3,3-diphenyl acrylate.

Among the above-mentioned various radiation energy absorbers, 2(2'-hydroxy-5'-methylphenyl)benzotriazole, 2(2'-hydroxy-3'-butyl-5'-(2"-carboxyoctyl-ethyl)phenyl) benzotriazole, 2-hydroxy-4-methoxybenzophenone, p-methylphenyl salicylate, 2-hydroxy-4-octyloxybenzophenone, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, and 2-(2'-hydroxy-5'-t-octylphenyl)benzotriazole are particularly preferred because of their high radiation energy absorbancy, satisfactory solubility in photohardenable resin compositions, and availability.

It is important that the total amount of the radiation energy absorber(s) to be added to the resin composition should fall within a range of from 0.001 to 1.0% by weight, preferably from 0.005 to 0.5% by weight, still preferably from 0.01 to 0.2% by weight, based on the liquid photohardenable resin composition containing a photo-polymerizable compound and an initiator. If the amount of the radiation energy absorber is less than 0.001% by weight, the objects of the present invention cannot be fully achieved, failing to provide three-dimensional objects with excellency in dimensional accuracy, dimensional stability and mechanical characteristics. If the amount exceeds 1.0% by weight, the rate of hardening of the resin composition in stereolithography would be reduced, resulting in serious reduction in forming rate, and the resulting three-dimensional objects have poor mechanical characteristics for practical use.

The amount of the radiation energy absorber, expressed in relation to the amount of the initiator contained in the photohardenable resin composition, is subject to variation according to the kind, etc. of the initiator. In general, addition of the radiation energy absorber in an amount of 0.001 to 0.25 part by weight per part by weight of the initiator is recommended for obtaining three-dimensional objects having excellent dimensional accuracy, dimensional stability, and mechanical characteristics without incurring a reduction of photopolymerization rate.

The resin composition for stereolithography containing the radiation energy absorber in the above-specified amount exhibits broadened latitude to applied light energy for obtaining a certain hardened depth (thickness). As a result, control on energy quantity for obtaining a desired hardened thickness can be conducted much more easily and smoothly than with conventional resin compositions for stereolithography. Incorporation of the radiation energy absorber additionally makes it possible to increase the reaction rate thereby to provide three-dimensional objects with improved mechanical characteristics.

While not clear, the mechanism of manifesting such great effects is considered to be as follows.

A radiation energy absorber added in a prescribed amount to a photohardenable resin composition absorbs part of energy of actinic light rays to serve for adjustment and levelling of the penetration depth of light energy chiefly in the Z-axial direction, thereby making the thickness of a photohardened layer uniform. At the same time, part of the light energy absorbed by the radiation energy absorber is converted to heat energy, which eventually participates in resin hardening. The presence of the radiation energy absorber does not therefore cause a reduction in resin hardening rate. Thus, even when stereolithography is carried out at a high forming rate, there is obtained a high quality three-dimensional object having superior characteristics such as dimensional accuracy and dimensional stability.

The photohardenable resin composition to be used in the present invention is not particularly limited, and any conventional liquid photohardenable resin composition, which is comprised predominantly of at least one photopolymerizable compound and contains a photosensitive polymerization initiator and is known useful for stereolithography, can be used. While not limiting, examples of useful photohardenable resin compositions include acrylate photohardenable resin compositions, urethane acrylate photohardenable resin compositions, epoxy photohardenable resin compositions, epoxyacrylate photohardenable resin compositions, and vinyl ether photohardenable resin compositions. These photohardenable resin compositions may contain either one or more than one photopolymerizable compounds. The kinds of photo-initiators for polymerization to be used are subject to variation according to the photo-polymerizable compounds to be combined with, and selected appropriately from, for example, photo-initiators for radical polymerization, photo-initiators for cationic polymerization, and combinations thereof.

Specific examples of useful photohardenable resin compositions are shown below only for illustrative purposes but not for limitation.

(1) Acrylate photohardenable resin composition: A liquid photohardenable resin composition of radical polymerization type which comprises mainly a monofunctional or polyfunctional polyester (meth)acrylate or polyether (meth)acrylate, may contain if desired a monofunctional or polyfunctional (meth)acrylate monomer, and contains a photo-initiator for radical polymerization. The term "(meth)acrylate" and the like used herein means "acrylate and/or methacrylate" and the like.

(2) Epoxyacrylate photohardenable resin composition: A liquid photohardenable resin composition which comprises mainly a monofunctional or polyfunctional epoxy(meth)acrylate, may contain if desired a monofunctional or polyfunctional (meth)acrylate monomer, and contains a photo-initiator for radical polymerization and, if desired, a photo-initiator for cationic polymerization.

(3) Urethane acrylate photohardenable resin composition: A liquid photohardenable resin composition of radical polymerization type which comprises mainly a monofunctional or polyfunctional urethane (meth)acrylate, may contain if desired a monofunctional or polyfunctional (meth)acrylate monomer, and contains a photo-initiator for radical polymerization.

(4) Epoxy photohardenable resin composition: A liquid photohardenable resin composition which comprises mainly at least one of aliphatic diepoxy compounds, alicyclic diepoxy compounds and aromatic diepoxy compounds, may contain if desired a monofunctional or polyfunctional (meth)acrylate monomer, and contains a photo-initiator for cationic polymerization and, if desired, a photo-initiator for radical polymerization.

(5) Vinyl ether photohardenable resin composition: A liquid photohardenable resin composition which comprises mainly an aliphatic divinyl ether compound, an alicyclic divinyl ether compound, an aromatic divinyl ether compound, etc. and contains a photo-initiator for cationic polymerization.

(6) Mixed photohardenable resin composition: A liquid photohardenable resin composition containing at least two of an acrylate compound, a urethane acrylate compound and an epoxyacrylate compound, and a photo-initiator for radical polymerization and, if desired, a photo-initiator for cationic polymerization.

The liquid photohardenable resin compositions (1) to (3) and (6) are disclosed in publications, and any of them can be used in the present invention. The photohardenable epoxy resin compositions are described, e.g., in JP-A-2-28261, and the vinyl ether photohardenable resin compositions are described, e.g., in JP-A-2-36925, R. J. Brautigam, *S. C. L. Apln.*, and J. R. Synder, *Radtech' 90 Conf. Papers,* Radtech. Intl., Chicago (1990).

Among these photohardenable resin compositions, it is preferable to use the urethane acrylate photohardenable resin compositions (3), epoxy photohardenable resin compositions (4), and the mixed photohardenable resin compositions containing urethane acrylate compounds of the compositions (6) in combination with the above-mentioned triazole compounds as the radiation energy absorber to prepare resin compositions for stereolithography of the present invention. Three-dimensional objects obtained from these resin compositions are particularly excellent in dimensional accuracy, dimensional stability, and mechanical characteristics.

If desired, the resin composition for stereolithography of the present invention may further contain leveling agents, surface active agents, organic high polymers, organic plasticizers, organic or inorganic fillers, and the like in a practically permissive amount that does not impair the effect of the present invention.

The method for preparing the resin composition of the present invention is not particularly limited, and the components are mixed together in a conventional manner. For example, a photo-polymerizable compound is prepared in a conventional process, and a photo-initiator for polymerization is added thereto in an atmosphere shielded from light, particularly from UV, to prepare a photohardenable resin composition. A radiation energy absorber is added to the resin composition also in a light-shielded atmosphere to prepare a resin composition for stereolithography of the present invention. The resulting resin composition for stereolithography is stored, transported, and sold in a light-shielded condition so as to prevent polymerization before working.

When the radiation energy absorber-containing resin composition of the present invention is stored in a light shielding container made of polyethylene, etc. at a temperature of 5° to 30° C., over a long period of time of about 36 to 48 months it undergoes no change in physical properties and the like and can still provide three-dimensional objects having excellent dimensional accuracy, dimensional stability, and mechanical characteristics smoothly.

In carrying out stereolithography using the resin composition of the present invention, any conventional technique and apparatus can be used. Examples of the actinic radiation include visible light, visible light containing an ultraviolet ray, and an ultraviolet ray. In particular, it is preferable to use actinic energy light generated from an Ar laser, an He-Cd laser, a xenon lamp, a metal halide lamp, a mercury lamp, a fluorescent tube, and the like. A laser beam is especially preferred because the energy level can be increased to reduce the forming time, and the satisfactory focusing character of a laser beam can be taken advantage of to provide a highly accurate three-dimensional object. The radiation energy (exposure energy) of the actinic radiation is generally 1 to 1,000 mJ/cm$^2$, preferably 5 to 500 mJ/cm$^2$.

As mentioned above, stereolithography using the resin composition of the present invention can be performed by using any known technique and stereolithography system with no particular restriction. Stereolithography processes which are typically employed in the present invention include a process in which actinic light energy rays are selectively applied to a surface of a liquid photohardenable resin composition containing a radiation energy absorber so as to provide a hardened layer having a desired pattern, the liquid photohardenable resin is newly introduced onto the surface of the hardened layer, followed by applying the actinic energy rays to successively form a hardened layer which is integrally connected to the preceding hardened layer, and these steps are performed repeatedly until the entire three-dimensional object is built up. The thickness of the respective hardened layer is generally 0.025 to 1.00 mm, preferably 0.050 to 0.500 mm. The resulting three-dimensional object may be used either as such or after it is subjected to post-hardening by irradiation or heating to further improve the mechanical characteristics and dimensional stability.

The structure, shape, and size of three-dimensional objects to be formed are not limited and can be determined depending on the end use. Examples of typical applications of the present invention include production of prototypes for verification of a designed model or for inspecting functions of parts, resin models for manufacturing casting molds, base models for manufacturing dies, and direct molding dies for producing trial products. More specifically, the present invention is applicable to production of models or models for processing for precision parts, electric and electronic parts, furniture, constructional structures, automobile parts, various containers, casting molds, dies, master molds and other models. The present invention exerts great effects especially on the production of models for precision parts which are required to have high dimensional accuracy and satisfactory dimensional stability.

The present invention will now be illustrated in greater detail with reference to Examples, but it should be understood that the present invention is not deemed to be limited thereto. Unless otherwise indicated, all the parts are given by weight.

REFERENCE EXAMPLE 1

Preparation of Photohardenable Urethane Acrylate Resin Composition (before addition of radiation energy absorber):

(1) In a 20 l volume four-necked flask equipped with a stirrer, a temperature controller, a thermometer, and a condenser were put 4600 parts of a propylene glycol (4 mol) adduct of bisphenol A and 4420 parts of isophorone diisocyanate, and 2.6 parts of di-n-butyltin dilaurate was added thereto at 40° to 50° C. The reaction mixture was allowed to react at that temperature for 30 minutes and then at 80° to 90° C. for 2 hours. To the reaction mixture were added 2320 parts of 2-hydroxyethyl acrylate and 5.5 parts of hydroquinone monomethyl ether, followed by allowing the mixture to further react at the same temperature for 2 hours to prepare a urethane acrylate oligomer having a bisphenol A diol skeleton.

(2) In a 5 l volume container were charged 1320 parts of the urethane acrylate oligomer obtained in (1) above, 1080 parts of polyethylene glycol 200 diacrylate ("NK Ester A-200" produced by Shin Nakamura Chemical Co., Ltd.), and 480 parts of ethylene oxide-modified trimethylolpropane triacrylate ("A-TMPT-3EO" produced by Shin Nakamura Chemical Co., Ltd.). After the container was evacuated and purged with nitrogen, the contents were stirred at 50° C. for about 1 hour.

(3) In a UV-shielded atmosphere 120 parts of 2,2-dimethoxy-2-phenylacetophenone (photo-initiator for radical polymerization "Irgacure 651" produced by Ciba-Geigy Ltd.) was added to 2880 parts of the mixture prepared in (2) above and completely dissolved by stirring at 25° C. for about 6 hours to prepare a liquid photohardenable urethane acrylate resin composition. The resulting composition was stored at 25° C. in an UV-shielded atmosphere.

REFERENCE EXAMPLE 2

Preparation of Photohardenable Epoxy Resin Composition (before addition of radiation energy absorber):

(1) In a 20 l volume four-necked flask equipped with a stirrer, a temperature controller, a thermometer, and a condenser were charged 4000 parts of 3,4-epoxycyclohexylmethyl-3',4'-epoxycyclohexane carboxylate, 1000 parts of 1,4-butanediol diglycidyl ether, 2500 parts of 2,2-bis(4-(acryloxydiethoixy)phenylpropane ("NK Ester A-BPE-4" produced by Shin Nakamura Chemical Co., Ltd.), and 2500 parts of ethylene oxide-modified trimethylolpropane triacrylate ("A-TMPT-3EO"). The mixture was stirred at 20 to 25° C. for about 1 hour.

(2) In a UV-shielded atmosphere 60 parts of 2,2-dimethoxy-2-phenylacetophenone (photo-initiator for radical polymerization "Irgacure 651") and 45 parts of bis(4-(diphenylsulfonio)phenyl)sulfide bishexafluoroantimonate (photo-initiator for cationic polymerization) were added to 3000 parts of the mixture prepared in (1) above and completely dissolved by stirring at 25° C. for about 6 hours to prepare a liquid photohardenable epoxy resin composition. The resulting composition was stored at 25° C. in an UV-shielded atmosphere.

REFERENCE EXAMPLE 3

Preparation of Photohardenable Epoxy Resin Composition (before addition of radiation energy absorber):

(1) In a 100 l volume container equipped with a stirrer, a temperature controller, a thermometer, and a condenser were charged 15,000 parts of 3,4-epoxycyclohexylmethyl-3',4'- epoxycyclohexane carboxylate, 5,000 parts of bisphenol A ethylene oxide-modified diacrylate (4 mol of ethylene oxide unit added, "NK Ester A-BPE-4" produced by Shin Nakamura Chemical Co., Ltd.), 4,000 parts of ethylene oxide-modified bisphenol A diacrylate (20 mol of ethylene oxide unit added, "NK Ester A-BPE-20", produced by Shin Nakamura Chemical Co., Ltd.), 3000 parts of ethylene oxide-modified pentaerythritol tetraacrylate ("ATM-4E" produced by Shin Nakamura Chemical Co., Ltd.), and 3000 parts of dicyclopentadienyl diacrylate (produced by Shin Kakamura Chemical Co., Ltd.), and the mixture was stirred at 20° to 25° C. for about 1 hour.

(2) In a UV-shielded atmosphere 600 parts of 1-hydroxycyclohexyl phenyl ketone (photo-initiator for radical polymerization "Irgacure 1841" produced by Ciba-Geigy Ltd.), 900 parts of bis(4-(diphenylsulfonio)phenyl) sulfide bishexafluoroantimonate (photo-initiator for cationic polymerization), and 600 parts of ethylene glycol were added to 30,000 parts of the mixture prepared in (1) above and completely dissolved by stirring at 25° C. for about 6 hours to prepare a liquid photohardenable epoxy resin composition. The resulting composition was stored at 25° C. in an UV-shielded atmosphere.

EXAMPLE 1

(1) To 100 parts of the urethane acrylate liquid photohardenable resin composition obtained in Reference Example 1 was added 0.01 part of 2-hydroxy-4-n-octoxybenzophenone as a radiation energy absorber. The mixture was thoroughly stirred at 25° C. for about 1 hour to obtain a uniform liquid resin composition for stereolithography.

(2) Fabrication by photohardening was carried out using the resin composition prepared in (1) above by means of an ultra-high speed stereolithography system ("SOLIFORM 300" produced by Teijin Seiki Co., Ltd.) with a water-cooled Ar laser (output: 400 mW; wavelength: 354, 365 nm; beam diameter: 0.2 mm; output on liquid surface: 175 mW) under conditions of an exposure energy of 50 mJ/cm$^2$, a slice pitch (hardened layer thickness) of 0.2 mm, and an average forming time of 2 minutes per layer.

The relationship between the hardened depth and the exposure energy was examined prior to fabrication of a part. The results were as shown in Table 1 below. The hardened depth was measured as follows.

Measurement of Hardened Depth:

Hardened depth was measured based on the theory disclosed in Paul F. Jacobs, *Rapid Prototyping & Manufacturing, Fundamentals of Stereo-Lithography*, Society of Manufacturing Engineers (1992). The exposure energy was controlled by varying the imaging speed to produce a hardened step-wedge comprised of 6 steps. The hardened step-wedge was taken out from the unhardened liquid surface with tweezers, cleaned to remove any unhardened resin, and the hardened layer thickness of step-wedge was measured with a constant pressure caliper for each exposure energy.

(3) A dumbbell specimen specified in JIS K7113 (maximum size: X-axis×Y-axis×Z-axis (thickness)=20.0 mm×175.0 mm×3.0 mm) was fabricated as a three-dimensional object (hardened part) by using the resin composition obtained in (1) above by means of the same ultra-high speed stereolithography system as used in (2) with a water-cooled Ar laser (output: 400 mW; wavelength: 354, 365 nm) under conditions of an exposure energy of 50 mJ/cm$^2$.

(4) The three-dimensional object obtained in (3) above was taken out from the stereolithography system and cleaned with isopropyl alcohol to remove unhardened resin. The Shore D hardness of the object (green hardness) was measured. The results obtained are shown in Table 1.

(5) The three-dimensional object cleaned the unhardened resin as obtained in (4) above was subjected to post hardening for 10 minutes with a 3 kW UV lamp. The Shore D hardness, tensile strength and tensile modulus of the post-hardened product were measured in accordance with JIS K7113. The results obtained are shown in Table 1.

(6) The dimensional accuracy and dimensional stability of the resulting three-dimensional object (dumbbell specimen) were evaluated according to the following rating system. The results of evaluation are shown in Table 1.

Rating System for Evaluation of Dimensional Accuracy and Dimensional stability of three-dimensional Object:

Dimensional Accuracy:

A . . . Dimensional deviations from the designed dimension in X-, Y- and Z-axial directions are each 0.01% or less (excellent)

B . . . Dimensional deviations from the designed dimension in X-, Y- and Z-axial directions are each more than 0.01 and not more than 0.03% (good)

C . . . Dimensional deviations from the designed dimension in X-, Y- and Z-axial directions are each more than 0.03% and not more than 0.05% (slightly poor)

D . . . Dimensional deviations from the designed dimension in X-, Y- and Z-axial directions are each more than 0.05% (poor)

Dimensional stability:

A . . . Dimensional changes after 1 month's standing at room temperature is not more than 0.1 mm in X-, Y- and Z-axial directions (excellent)

B . . . Dimensional changes after 1 month's standing at room temperature is more than 0.1 mm and not more than 0.3 mm in X-, Y- and Z-axial directions (good)

C . . . Dimensional changes after 1 month's standing at room temperature is more than 0.3 mm and not more than 0.5 mm in X-, Y- and Z-axial directions (slightly poor)

D . . . Dimensional changes after 1 month's standing at room temperature is more than 0.5 mm in X-, Y- and Z-axial directions (poor)

EXAMPLE 2

A resin composition for stereolithography was prepared in the same manner as in Example 1-(1) except for using 0.05 part of 2-hydroxy-4-methoxybenzophenone as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

EXAMPLE 3

A resin composition for- stereolithography was prepared in the same manner as in Example 1-(1) except for using 0.1 part of 2-hydroxy-4-n-octoxybernzophenone as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

EXAMPLE 4

A resin composition for stereolithography was prepared in the same manner as in Example 1-(1) except for using 0.05 part of p-methylphenyl salicylate as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown-in Table 1.

EXAMPLE 5

A resin composition for stereolithography was prepared in the same manner as in Example 1-(1) except for using 0.01 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

EXAMPLE 6

A resin composition for stereolithography was prepared in the same manner as in Example 1-(1) except for using 0.05 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

EXAMPLE 7

A resin composition for stereolithography was prepared in the same manner as in Example 1-(1) except for using 0.1 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

COMPARATIVE EXAMPLE 1

Fabrication by photohardening was carried out using the liquid photohardenable urethane acrylate resin composition prepared in Reference Example 1 as such in the same manner as in Example 1-(2) and (3). The hardened depth and mechanical characteristics of the resulting three-dimensional object were measured in the same manner as in Example 1. The results obtained are shown in Table 1 below.

The dimensional accuracy and dimensional stability of the resulting three-dimensional object (dumbbell specimen) were evaluated in the same manner as in Example 1. The results of evaluation are shown in Table 1.

TABLE 1

| Example No. | Hardened Depth ($\mu$m) Exposure Energy (mJ/cm$^2$) | | | | | | Green Hardness Shore D | Physical Properties After Post-Hardening | | | Dimensional Characteristics | |
|---|---|---|---|---|---|---|---|---|---|---|---|---|
| | 10 | 30 | 60 | 80 | 100 | 120 | | Hardness Shore D | Tensile Strength (kg/mm$^2$) | Tensile Modulus (kg/mm$^2$) | Dimensional Accuracy | Dimensional Stability |
| Example 1 | 120 | 280 | 370 | 420 | 460 | 490 | 65 | 87 | 4.5 | 120 | B | B |
| Example 2 | 70 | 210 | 300 | 350 | 390 | 410 | 68 | 88 | 4.8 | 180 | B | B |
| Example 3 | 50 | 120 | 170 | 200 | 220 | 250 | 72 | 89 | 5.1 | 210 | A | A |
| Example 4 | 80 | 220 | 310 | 370 | 400 | 420 | 64 | 87 | 4.8 | 185 | B | B |
| Example 5 | 120 | 290 | 370 | 420 | 470 | 510 | 68 | 90 | 4.8 | 145 | B | B |
| Example 6 | 80 | 210 | 300 | 360 | 390 | 410 | 72 | 90 | 5.2 | 205 | A | A |
| Example 7 | 50 | 110 | 160 | 200 | 220 | 240 | 75 | 91 | 5.8 | 230 | A | A |
| Comparative Example 1 | 140 | 320 | 430 | 470 | 510 | 560 | 60 | 80 | 3.8 | 96 | C | D |

The results in Table 1 reveal the following. In Examples 1 to 7 where fabrication is conducted using a resin composition prepared by adding a specific amount of a radiation energy absorber to a photohardenable urethane acrylate resin composition, the penetration depth of such high energy light as an Ar laser beam in the Z-axis is moderately adjusted so as not to be excessive and thereby to form a hardened layer of a prescribed thickness as designed. The resulting three-dimensional object is excellent in not only dimensional accuracy and stability but mechanical characteristics such as hardness, tensile strength and tensile modulus.

In Comparative Example 1, on the other hand, the photohardenable resin composition containing no radiation energy absorber is used as such for stereolithography. In the case where fabrication is performed with high light energy of, e.g., an Ar laser beam, the light penetrates in the Z-axial direction too deep, and a failure of forming a hardened layer of desired thickness can result. As a result, besides having poor dimensional accuracy and stability, the resulting three-dimensional object are greatly inferior to those obtained in Examples 1 to 7 in terms of mechanical characteristics such as hardness, tensile strength and tensile modulus.

EXAMPLE 8

(1) To 100 parts of the liquid photohardenable epoxy resin composition obtained in Reference Example 2 was added 0.05 part of 2(2'-hydroxy-5'-methylphenyl)benzotriazole as a radiation energy absorber, and the mixture was thoroughly stirred at 25° C. for about 1 hour to prepare a uniform liquid resin composition for stereolithography.

(2) Fabrication by photohardening was carried out using the resin composition prepared in (1) above by means of an ultra-high speed stereolithography system ("SOLIFORM 500" produced by Teijin Seiki Co., Ltd.) with an air-cooled He/Cd laser manufactured by Kimmon Denki K.K. (output: 100 mW; wavelength: 325 nm) under conditions of an exposure energy of 20 mJ/cm$^2$, a slice pitch (hardened layer thickness) of 0.10 mm, and an average forming time of 3 minutes per layer. The relationship between the hardened depth and the exposure energy was examined prior to stereolithography in the same manner as in Example 1. The results obtained are shown in Table 2 below.

(3) Fabrication by photohardening was carried out using the resin composition prepared in (1) above in the same manner as in Example 1-(2) and (3). The mechanical characteristics of the resulting three-dimensional object were measured in the same manner as in Example 1. The results obtained are shown in Table 2 below.

The dimensional accuracy and dimensional stability of the resulting three-dimensional object (dumbbell specimen) were evaluated in the same manner as in Example 1. The results of evaluation are shown in Table 2.

EXAMPLE 9

A resin composition for stereolithography was prepared in the same manner as in Example 8-(1) except for using 0.01 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object obtained by using an Ar laser beam were measured in the same manner as in Example 1. The results obtained are shown in Table 2.

The dimensional accuracy and dimensional stability of the resulting three-dimensional object (dumbbell specimen) were evaluated in the same manner as in Example 1. The results of evaluation are shown in Table 2.

EXAMPLE 10

A resin composition for stereolithography was prepared in the same manner as in Example 8-(1) except for using 0.05 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object obtained by using an Ar laser beam were measured in the same manner as in Example 1. The results obtained are shown in Table 2.

The dimensional accuracy and dimensional stability of the resulting three-dimensional object (dumbbell specimen) were evaluated in the same manner as in Example 1. The results of evaluation are shown in Table 2.

EXAMPLE 11

A resin composition for stereolithography was prepared in the same manner as in Example 8-(1) except for using 0.1 part of 2(2'-hydroxy-5'-methylphenyl)benzotriazole as a radiation energy absorber. Fabrication by photohardening was carried out using the resulting resin composition in the same manner as in Example 1-(2) and (3). The hardened depth and mechanical characteristics of the resulting three-dimensional object obtained by using an Ar laser beam were measured in the same manner as in Example 1. The results obtained are shown in Table 2.

The dimensional accuracy and dimensional stability of the resulting three-dimensional object (dumbbell specimen) were evaluated in the same manner as in Example 1. The results of evaluation are shown in Table 2.

COMPARATIVE EXAMPLE 2

Fabrication by photohardening was carried out using the liquid photohardenable epoxy resin composition prepared in Reference Example 2 as such in the same manner as in Example 9. The hardened depth and mechanical characteristics of the resulting three-dimensional object were measured in the same manner as in Example 1. The results obtained are shown in Table 2 below.

The dimensional accuracy and dimensional stability of the resulting three-dimensional object (dumbbell specimen) were evaluated in the same manner as in Example 1. The results of evaluation are shown in Table 2.

TABLE 2

| Example No. | Hardened Depth ($\mu$m) Exposure Energy (mJ/cm$^2$) | | | | | | Green Hardness Shore D | Physical Properties After Post-Hardening | | | Dimensional Characteristics | |
|---|---|---|---|---|---|---|---|---|---|---|---|---|
| | 20 | 50 | 100 | 150 | 190 | 220 | | Hardness Shore D | Tensile Strength (kg/mm$^2$) | Tensile Modulus (kg/mm$^2$) | Dimensional Accuracy | Dimensional Stability |
| Example 8 | 120 | 250 | 320 | 400 | 420 | 440 | 68 | 91 | 5.4 | 215 | A | B |
| Example 9 | 130 | 260 | 350 | 420 | 450 | 480 | 65 | 90 | 4.1 | 165 | B | B |
| Example 10 | 100 | 200 | 280 | 340 | 380 | 400 | 70 | 91 | 6.2 | 297 | A | A |

TABLE 2-continued

| Example No. | Hardened Depth (μm) Exposure Energy (mJ/cm$^2$) | | | | | | Green Hardness Shore D | Physical Properties After Post-Hardening | | | Dimensional Characteristics | |
|---|---|---|---|---|---|---|---|---|---|---|---|---|
| | 20 | 50 | 100 | 150 | 190 | 220 | | Hardness Shore D | Tensile Strength (kg/mm$^2$) | Tensile Modulus (kg/mm$^2$) | Dimensional Accuracy | Dimensional Stability |
| Example 11 | 50 | 110 | 170 | 200 | 220 | 250 | 73 | 91 | 6.2 | 297 | A | A |
| Comparative Example 2 | 160 | 290 | 420 | 480 | 510 | 530 | 56 | 87 | 3.2 | 102 | D | D |

The results in Table 2 reveal the following. In Examples 8 to 11 where stereolithography is conducted using a resin composition prepared by adding a specific amount of a radiation energy absorber to a photohardenable epoxy resin composition, the penetration depth of such high energy light as an Ar laser beam or an He/Cd laser beam in the Z-axis is moderately adjusted so as not to be excessive and thereby to form a hardened layer of a prescribed thickness as designed. The resulting three-dimensional object is excellent in not only dimensional accuracy and stability but mechanical characteristics such as hardness, tensile strength and tensile modulus.

In Comparative Example 2, on the other hand, the photohardenable epoxy resin composition containing no radiation energy absorber is used as such for stereolithography. In the case where fabrication is performed with high energy light, e.g., an Ar laser beam or an He/Cd laser beam, the light penetrates in the Z-axis too deep, and a failure of forming a hardened layer of desired thickness can result. As a result, besides having poor dimensional accuracy and stability, the resulting three-dimensional object are greatly inferior to those obtained in Examples 1 to 7 in terms of mechanical characteristics such as hardness, tensile strength and tensile modulus.

EXAMPLE 12

(1) To 1000 parts of the liquid photohardenable epoxy resin composition obtained in Reference Example 3 was added 0.5 part of 2(2'-hydroxy-3'-butyl-5'-(2'-carboxyoctylethyl)phenyl)benzotriazole ("Tinuvin 384" produced by Ciba-Geigy Ltd.) represented by formula (V) shown below, and the mixture was thoroughly stirred at 25° C. for about 1 hour to prepare a uniform liquid resin composition for stereolithography.

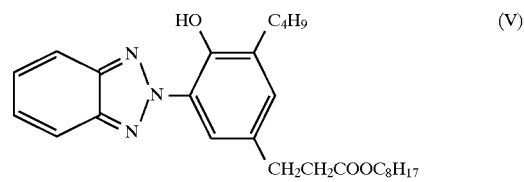

(2) A rectangular parallelopiped (three-dimensional object) (X/Y/X=50 mm×4 mm×20 mm) having through-holes A to F having diameters varying form 10.000 mm to 1.000 mm as shown in FIG. 1 was produced by stereolithography of the resin composition prepared in (1) above by means of an ultra-high speed stereolithography system "SOLIFORM 500" with a water-cooled Ar laser (output: 400 mW; wavelength: 333, 351, 364 nm) under conditions of an exposure energy of 70 mJ/cm$^2$, a slice pitch (hardened layer thickness) of 0.1016 mm, and an average forming time of 4 minutes per layer. The exposure energy was controlled according to general instructions of SOLIFORM system.

(3) The inner diameter (x) of through-holes A to F on the X-axis and that on the Y-axis (y) were measured to obtain an x/y ratio, indicative of the degree of roundness. The results obtained are shown in Table 3 below.

COMPARATIVE EXAMPLE 3

A three-dimensional object shown in FIG. 1 was produced in the same manner as in Example 12, except for using the liquid photohardenable epoxy resin composition obtained in Reference Example 3 as such. The x/y ratio was obtained in the same manner as in Example 12 to examine the degree of roundness of each through-hole. The results obtained are shown in Table 3 below.

TABLE 3

| | Example 12 | | | | | | Comparative Example 3 | | | | | |
|---|---|---|---|---|---|---|---|---|---|---|---|---|
| | A | B | C | D | E | F | A | B | C | D | E | F |
| Design diameter (mm) | 10.000 | 5.000 | 4.000 | 3.000 | 2.000 | 1.000 | 10.000 | 5.000 | 4.000 | 3.000 | 2.000 | 1.000 |
| Measured inner diameter: | | | | | | | | | | | | |
| x (mm) | 10.026 | 4.992 | 4.015 | 3.048 | 2.040 | 0.960 | 10.015 | 4.997 | 4.013 | 3.033 | 2.045 | 0.965 |
| z (mm) | 10.206 | 5.052 | 4.001 | 2.974 | 1.929 | 0.852 | 9.680 | 4.768 | 3.551 | 2.259 | 1.263 | 0* |
| z/x | 1.0180 | 1.0120 | 0.9965 | 0.9757 | 0.9456 | 0.8875 | 0.9666 | 0.9541 | 0.8849 | 0.7448 | 0.6176 | 0* |

Note: *The hole was completed plugged only showing a line in the Z-axial direction as a trace of the hole.

It is seen from the results in Table 3 that stereolithography using the resin composition of Example 12 which contained a radiation energy absorber achieves satisfactory control of penetration depth of light energy particularly in the Z-axial direction to avoid excessive penetration. Accordingly, the resin composition of Example 12 was proved to provide a three-dimensional object in good agreement with the desired dimension and shape, i.e., with extremely high dimensional precision and dimensional stability, showing little deviation from the design of through-holes A to F particularly in the Z-axial direction.

On the other hand, in Comparative Example 3 using a photohardenable resin composition containing no radiation energy absorber, penetration depth of light energy in the Z-axial direction cannot be smoothly controlled, resulting in considerable dimensional errors of through-holes A to F, particularly plugging of the holes in the Z-axial direction. It is seen that the degree of errors increases as the diameter of the hole decreases, failing to provide a three-dimensional object in agreement with the desired dimension and shape.

According to the present invention, three-dimensional objects having excellent dimensional accuracy and stability especially in the Z-axial direction can be provided through an extremely simple method of adding a prescribed amount of a radiation energy absorber to a photohardenable resin composition.

The three-dimensional objects obtained by the present invention exhibit excellent physical and mechanical characteristics, such as hardness, tensile strength and tensile modulus, as well as the excellent dimensional accuracy and stability and can therefore be effectively used in a wide variety of application.

Notwithstanding the existence of a radiation energy absorber, the resin composition of the present invention can be used for stereolithography in a conventional manner using high energy light to provide three-dimensional objects at a high speed and good productivity.

The present invention provides three-dimensional objects with higher dimensional accuracy in both the X- and Y-axial directions than obtained in conventional techniques using photohardenable resin compositions containing a light polarizing substance (light scattering substance).

While the invention has been described in detail and with reference to specific examples thereof, it will be apparent to one skilled in the art that various changes and modifications can be made therein without departing from the spirit and scope thereof.

What is claimed is:

1. A resin composition for stereolithography comprising (1) a liquid photohardenable resin composition comprising an epoxy photohardenable resin composition and a monofunctional or polyfunctional (meth)acrylate monomer, at least one photo-polymerizable compound selected from the group consisting of aliphatic diepoxy compounds, alicyclic diepoxy compounds and aromatic diepoxy compounds, and a photo-initiator for polymerization, and (2) at least one radiation energy absorber in an amount of from 0.001 to 1.0% by weight based on the total amount of said liquid photohardenable resin composition (1), wherein said at least one radiation energy absorber (2) has an absorbance in a wavelength region of from 300 to 350 nm of at least 0.1 when measuring a solution obtained by dissolving 1 mg of said at least one radiation energy absorber in 100 ml of ethanol which is placed in a quartz cell having a light path length of 10 mm and said at least one radiation energy absorber (2) is selected from the group consisting of:

(i) a benzotriazole compound represented by the formula (I):

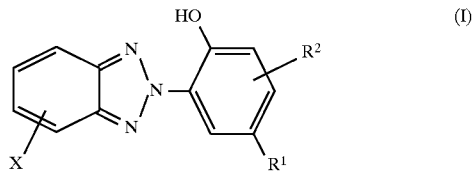

wherein $R^1$ and $R^2$ are independently selected from the group consisting of a hydrogen atom, linear or branched chain substituted or unsubstituted alkyl groups having from 1 to 20 carbon atoms, and substituted or unsubstituted phenyl groups; and X is a hydrogen atom or a halogen atom;

(ii) a benzophenone compound represented by formula (II):

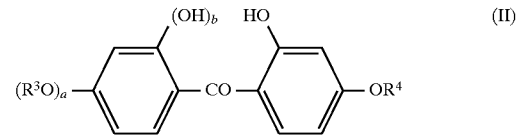

wherein $R^3$ and $R^4$ are independently selected from the group consisting of a hydrogen atom, linear or branched chain substituted or unsubstituted alkyl groups having from 1 to 20 carbon atoms, and substituted or unsubstituted phenyl groups; a is 0 or 1; and b is 0 or 1;

(iii) a phenyl salicylate compound is represented by formula (III):

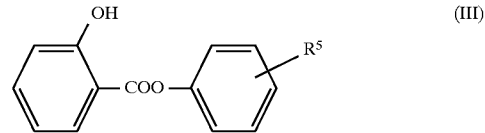

wherein $R^5$ is selected from the group consisting of a hydrogen atom, linear or branched chain substituted or unsubstituted alkyl groups having from 1 to 20 carbon atoms, and substituted or unsubstituted phenyl groups; and (iv) a cyanoacrylate compound represented by formula (IV):

wherein $R^6$ and $R^7$ are independently selected from the group consisting of a hydrogen atom, linear or branched chain substituted or unsubstituted alkyl groups having from 1 to 20 carbon atoms, and substituted or unsubstituted phenyl groups; and $R^8$ is a linear or branched chain alkyl group having from 1 to 20 carbon atoms.

2. A process for fabricating an integral three-dimensional object from successive layers of a photohardenable liquid resin composition, said process comprising the steps of:

(a) forming a layer of a photohardenable liquid resin composition;

(b) photohardening at least a portion of said layer of said photohardenable liquid resin composition by exposure to an actinic radiation to form a hardened layer;

(c) introducing a new layer of said photohardenable liquid resin composition onto said hardened layer formed by exposure to an actinic radiation;

(d) photohardening at least a portion of said new layer of said photohardenable liquid resin composition by exposure to an actinic radiation;

(e) repeating the steps (c) and (d), said photohardenable liquid resin composition being a resin composition according to claim 1.

3. A process for fabricating a three-dimensional object by stereolithography as claimed in claim 2, wherein said actinic radiation is an ultraviolet ray or a light containing an ultraviolet ray.

* * * * *